United States Patent [19]

Rosenthal

[11] Patent Number: 5,334,883

[45] Date of Patent: Aug. 2, 1994

[54] CIRCUIT FOR INTRODUCING HYSTERISIS

[75] Inventor: Bruce D. Rosenthal, Los Gatos, Calif.

[73] Assignee: Elantec, Inc., Milpitas, Calif.

[21] Appl. No.: 12,595

[22] Filed: Feb. 3, 1993

[51] Int. Cl.$^5$ .................. H03K 3/295; H03K 5/158
[52] U.S. Cl. ................................. 307/290; 307/270; 307/359; 307/585
[58] Field of Search ............. 307/451, 448, 290, 573, 307/585, 359, 270

[56] References Cited

U.S. PATENT DOCUMENTS

| | | | |
|---|---|---|---|
| 4,506,168 | 3/1985 | Uya | 307/290 |
| 4,539,489 | 9/1985 | Vaughn | 307/290 |
| 4,603,264 | 7/1986 | Nakano | 307/290 |
| 4,703,201 | 10/1987 | McGrail | 307/290 |
| 4,786,825 | 11/1988 | O'Shaughnessy et al. | 307/290 |
| 5,034,623 | 7/1991 | McAdams | 307/451 |
| 5,115,434 | 5/1992 | Aizaki | 307/451 |

Primary Examiner—Timothy P. Callahan
Assistant Examiner—My-Trang Nu Ton
Attorney, Agent, or Firm—Albert C. Smith

[57] ABSTRACT

A novel driver circuit and feedback loop is provided that improves the response time of the driver circuit and produces threshold voltages and hysteresis levels which are substantially independent of the supply voltage. The feedback circuit uses a pair of transistors connected in a cascode configuration to provide positive feedback from the output of the driver circuit and to control this feedback by means of the signal at the driver circuit input. By coupling the input voltages to the gate of a cascode transistor, the response time of the driver circuit is improved without disturbing its high input impedance. In addition, by replacing a transistor in the driver circuit input buffer with a current source, the threshold voltage of the driver circuit can be made substantially independent of the supply voltage.

6 Claims, 4 Drawing Sheets

CIRCUIT FOR INTRODUCING HYSTERISIS

FIELD OF THE INVENTION

The present invention relates to the field of feedback circuits for introducing hysteresis, and in particular to feedback circuits for introducing hysteresis in inverter-based driver circuits.

BACKGROUND OF THE INVENTION

Driver circuits often include a feedback loop to increase noise immunity and to improve output waveforms by means of hysteresis. Typically, a driver circuit includes a pair of inverting buffers connected in series, and hysteresis is introduced by means of a third inverting buffer which couples the output of the second inverting buffer back to an inter-buffer node at the input of the second inverting buffer. Positive feedback to this inter-buffer node shifts the threshold voltage at which the driver circuit output switches between states and speeds the transition between states once the switching point has been reached.

A number of undesirable side effects result when hysteresis is introduced into a circuit in the manner described above. For example, the threshold voltage of the driver circuit and the level of hysteresis are sensitive to variations in the supply voltage. In addition, signal propagation through the driver circuit is delayed since the driving signal must overcome the feedback signal at the inter-buffer node before the second buffer can begin to switch states.

SUMMARY OF THE INVENTION

The present invention is a driver circuit operating in conjunction with a feedback circuit to provide threshold voltages and hysteresis levels which are substantially independent of the supply voltage. The feedback circuit of the present invention also improves the response time of the driver circuit over that obtainable with a conventional feedback circuit by controlling the feedback current with the input signal.

The driver circuit of the present invention uses a pair of transistors connected in a cascode configuration to provide positive feedback from the output of the driver circuit and to control this feedback by means of the signal at the driver circuit input. The input and output of the driver circuit are coupled to the feedback circuit through the gates of the cascode connected transistors, which form the inputs of the cascode configuration. The output of the cascode connected transistors is connected to the driver circuit at the inter-buffer node.

With this configuration, feedback coupled from the driver circuit output by one of the cascode transistors can be controlled by the driver circuit input signal applied to the other cascode transistor. Provided that the width to length ratio (W/L ratio) of the cascode transistor coupled to the driver circuit input is smaller than the W/L ratio of the cascode transistor coupled to the driver circuit output, the resulting hysteresis level will be substantially independent of the supply voltage. Further, by converting one of the transistors of the driver circuit input inverter into a current source, the threshold voltage of the driver circuit can be made substantially independent of the supply voltage. Since the input of the driver circuit is connected to the gate of a cascoded transistor, these improvements do not interfere with the high input impedance of the driver circuit.

DETAILED DESCRIPTION OF THE INVENTION

Figure 1A:
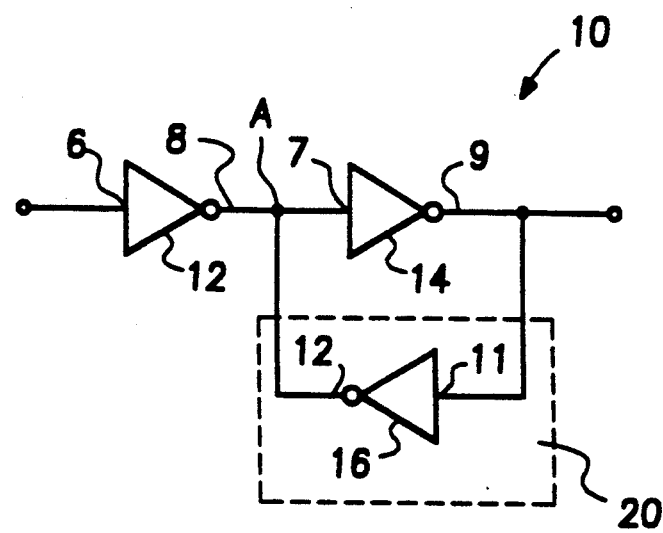
FIG. 1A is a block diagram of a conventional circuit for introducing hysteresis into an inverter-based driver circuit.

Referring to FIG. 1A, there is shown a block diagram of a conventional feedback circuit for introducing hysteresis into an inverter-based driver circuit 10. In the conventional driver circuit 10, a pair of inverting buffers 12, 14 are connected in series. An input 6 of inverter 12 and output 9 of inverter 14 form the input 6 and output 9, respectively, of driver circuit 10. A feedback circuit 20 comprises a third inverting buffer 16 which is chosen to have a smaller W/L ratio than inverters 12, 14. Inverter 16 has an input 11 connected to driver output 9 and an output 13 connected to input 7 of inverting buffer 14 and to output 8 of inverting buffer 12, for coupling a signal from driver output 9 back to input 7 of buffer 14. The common point of outputs 8, 11 and input 7 is labelled node A.

Figure 1B:
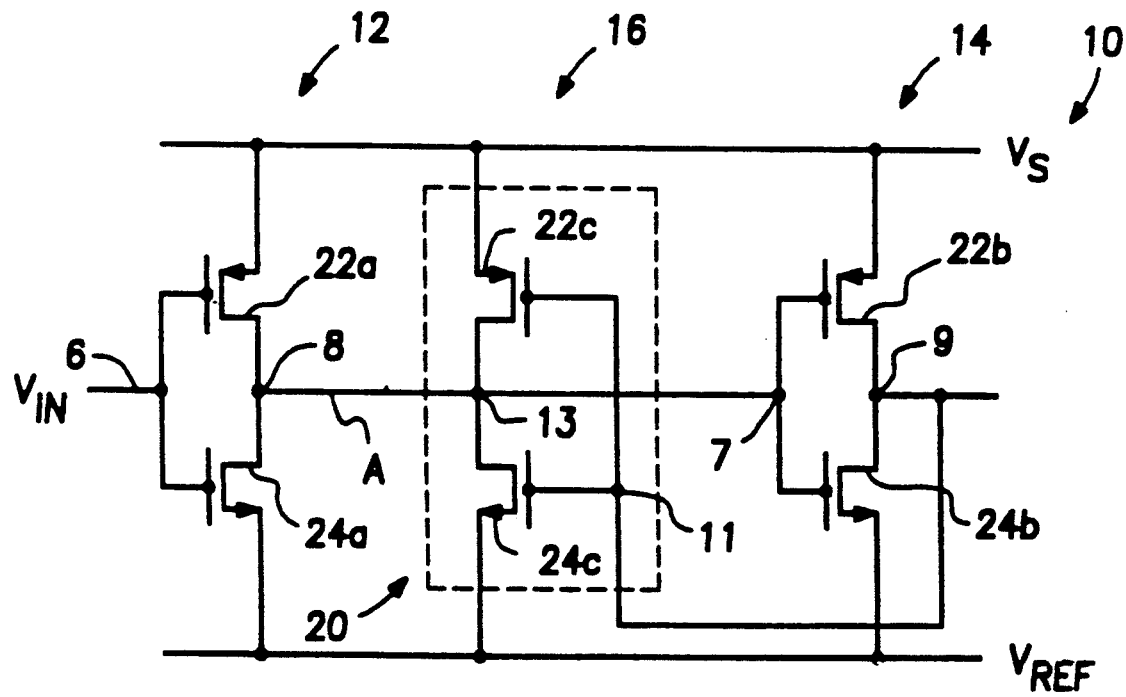
FIG. 1B is a schematic diagram of one conventional inverterbased driver circuit based on CMOS inverters.

Referring now to FIG. 1B, there is shown a detailed schematic of one embodiment of driver circuit 10. In this circuit, each of the inverting buffers 12, 14, 16 is configured as a standard CMOS inverter. For example, inverter 12 comprises a complimentary pair of transistors 22a, 24a, having their sources connected to a supply voltage (Vs) and reference voltage ($V_{REF}$), respectively, their drains connected together to form output 8, and their gates connected together to form input 6. Thus, when the voltage at input 6 of inverter 12, $V_{IN}$, rises above the threshold voltage of transistor 24a, $V_{TN}$, transistor 24a will begin conducting current. As $V_{IN}$ continues to rise, the current sunk by transistor 24a increases while the current sourced by transistor 24a decreases. When the current sunk by transistor 24a exceeds the current sourced by transistor 22a, the voltage at output 8 drops to $V_{REF}$. On the other hand, when $V_{IN}$ decreases from a voltage which is initially greater than $V_{TP}$, the threshold voltage for transistor 22a, transistor 22a begins to conduct current. As $V_{IN}$ continues to drop the current sourced by transistor 22a begins to increase while that sunk by transistor 24a begins to decrease. As $V_{IN}$ drops below a critical voltage, $V_{TH}$, the current sourced by transistor 22a overrides the current sunk by transistor 24a and the voltage at output 8 rises to $V_s$.

Thus, with $V_{IN}$ below $V_{TH}$, transistor 22a is on and transistor 24a is off, putting output 8 of inverter 12 at $V_s$. As $V_{IN}$ increases towards $V_{TH}$, transistors 22a, 24a begin to switch, causing current to flow in inverter 12. Since node A has a finite capacitance, C, slew rate at node A is given by:

$$dV/dt = I/C = (I_P - I_N)/C, \qquad \text{Eq. I}$$

where $I_P$ is the current flowing into node A from transistor 22a, $I_N$ is the current flowing out of node A through transistor 24a, and $I = I_P - I_N$ is the net current flowing into node A. According to equation (I), the voltage at node A does not begin to decrease until $I_N$ exceeds $I_P$. Ignoring the output impedances of transistors 22a, 24a, $V_{TH}$ is just the voltage at which $I_N$ is equal to $I_P$.

For well matched transistors 22a, 24a and no feedback to node A, $I_N$ and $I_P$ will be approximately equal when $V_{IN}$ is increased to about $0.5V_s$. However, in circuit 10, the voltage at node A is clamped by feedback inverter 16, which resists decreases in the voltage at node A by sourcing additional current, $I_P$, through transistor 22c to node A. As a result, the gate drive to transistor 24a necessary to generate $I_N$ greater than $I_P + I_P$, VTH, exceeds $0.5V_S$ by an amount which is determined by feedback circuit 20, and in particular by the W/L ratios of transistors 22c, 24a relative to those of transistors 22a, 24a.

Thus, the voltage at node A will begin to decrease only when the clamping effect of transistor 22c is overcome by $V_{IN}$. Once this occurs, transistors 22b, 24b of inverter 14 switch, bringing the voltage of output 9 towards $V_s$. As a result, transistors 22a, 24a begin to switch, accelerating the rate at which the voltage of node A drops. A reciprocal process occurs when $V_{in}$ decreases from above $V_{TH}$ to below $V_{TH}$.

Figure 2:
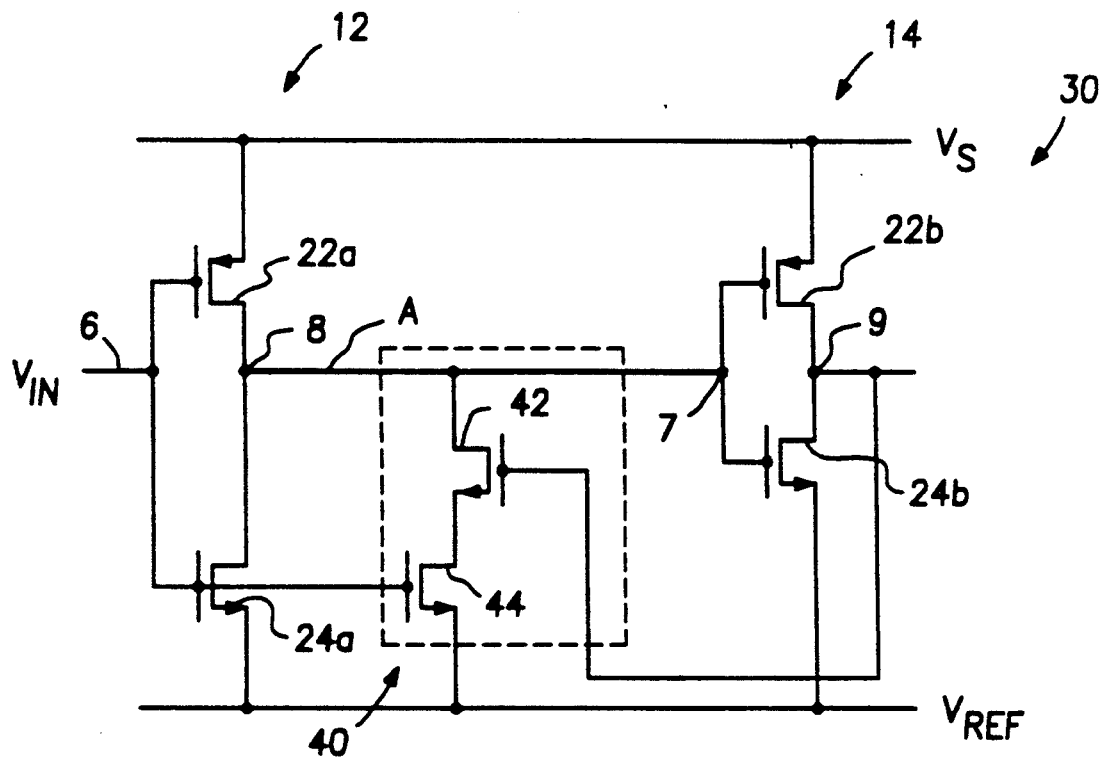
FIG. 2 is a schematic diagram of a circuit in accordance with the present invention for introducing hysteresis into an inverter-based driver circuit.

Referring now to FIG. 2, there is shown a schematic diagram of a driver circuit 30, including a feedback circuit 40 in accordance with the present invention. As in conventional driver circuit 10, driver circuit 30 includes inverters 12, 14 comprising transistors 22a, 24a and 22b, 24b, respectively. However, feedback circuit 40 comprises transistors 42, 44 connected in a cascode configuration rather than in the standard CMOS inverter configuration of feedback circuit 10. Thus, the gate of transistor 42 is connected to output 9, its drain is connected to inverter input 7, and its source is connected to the drain of transistor 44. The gate of transistor 44 is connected to input 6 and the source is connected to a ground reference voltage.

With $V_{IN}$ below the $V_{TN}$ of transistors 24a, 44, these are off, transistor 22a is on, node A is high, and no current flows in inverter 22. At the same time, transistor 24b is on and transistor 22b is off, holding driver output 9 low and maintaining transistor 42 off. As $V_{IN}$ rises above $V_{TN}$ toward $V_{TH}$ inverter Z2 begins to switch, causing current to flow through node A as transistor 22a begins to turn off and transistor 24a turns on.

As in the conventional driver circuit 10, the voltage at node A will begin to drop only when $I_N$ exceeds $I_P$. However, unlike driver circuit be node A is not clamped at $V_{REF}$ when either of cascode transistors 42, 44 is turned off. Thus, the voltage at node A can respond quickly to changes in $V_{IN}$ as long as $V_{IN}$ also controls the current path from node A through cascode connected transistors 42, 44 by means of one of the transistors 42, 44. Further, under these circumstances, the level of hysteresis depends on the gate voltages, $V_{TN}$, necessary to turn on transistors 42, 44, and these depend in turn on the W/L ratios of transistors 42, 44.

The dependence of the hysteresis level on the W/L ratios of cascode transistors 42, 44 arises from the dependence of $V_{TN}$ of transistors 42, 44 on this ratio and the fact that the voltage change at output 9 will lag behind $V_{IN}$ due to the finite response time of the circuit devices. As a result, when $V_{IN}$ reaches $V_{TN}$ for transistor 44, the voltage at the gate of cascode transistor 42 will still be less than $V_{TN}$. For the case where transistors 42, 44, have equal W/L ratios and consequently equal $V_{TN}$S, transistor 42 will remain off and no $I_N$ will flow through cascode transistors 42, 44 until the voltage at output 9 catches up with $V_{IN}$. By choosing transistor 42 with a larger W/L ratio than transistor 44, $V_{TN}$ for transistor 42 is reduced. In the preferred embodiment of the invention, the W/L ratio of transistor 42 is chosen so that once $V_{IN}$ is sufficient to turn on transistor 44, transistor 42 will turn on as soon as the voltage at node A begins to increase.

With this configuration, the cascode current path will be controlled by transistor 44 and consequently by $V_{IN}$. Thus, where input 6 is initially below $V_{TN}$ for transistor 24a, transistors 24a, 42, 44 are off and transistor 22a is on, leaving node A at high voltage and output 8 at low voltage. As $V_{IN}$ rises above $V_{TN}$, transistor 24a begins to conduct current, and as $V_{IN}$ continues to rise, the current sunk by transistor 24a increases while that sourced by transistor 22a decreases. The voltage at node A will not change until $I_N$ exceeds $I_P$ so the voltage at output 9 remains at $V_{REF}$ initially, holding transistor 42 off and preventing current flow through cascode transistors 42,44. Once $V_{IN}$ exceeds $0.5V_s$, however, $I_N$ is approximately equal to $I_P$ and the voltage at node A begins to drop. As a result, the voltage at output 9 of inverter 14 begins to rise, turning on transistor 42. The resulting current $I_N$ through cascode transistors 42, 44 increases the net current flowing out of node A, accelerating the rate at which the voltage at node A drops.

For voltage swings in the opposite direction, a reciprocal process occurs. Thus, initially, transistors 24a, 42, 44 are turned on, transistor 22a is turned off, and node A is at $V_{REF}$. As $V_{IN}$ decreases below $V_{TP}$, transistor 22a begins to source current while the current sunk by transistors 24a, 42 begins to decrease. Initially, additional current $I_N$ flows through cascode transistors 42, 44 as transistors 22a, 24a switch. As a result, a larger current $I_P$ through transistor 22a is necessary to increase the voltage of node A. This larger $I_P$ is generated by providing more base drive to transistor 22a, pushing $V_{TH}$ below $0.5V_s$ and introducing hysteresis into driver circuit 30. As noted above, the size of $I_N$ and the $V_{IN}$ at which transistors 42, 44 switch on are controlled by the relative source areas of these transistors, providing a means for controlling hysteresis which is independent of $V_s$.

The voltage at which driver circuit 30 begins to switch can be made substantially independent of the supply voltage, $V_s$ by modifying inverter 12. According to equation I, node A, the output of inverter 12 begins to change voltage states when $I_N$ and $I_P$ are equal. For a standard CMOS inverter, this occurs when $V_{IN}$ is approximately 0.5 $V_s$. However, the current sourced by transistor 22a can be made independent of $V_S$ by applying a bias voltage to its gate. Under these conditions, the point at which $I_N$ equals $I_P$ will be determined by the current sunk by transistor 24a, and this is determined by $V_{IN}$.

Referring now to FIG. 3, there is shown a driver circuit so having a threshold voltage, $V_{TH}$, that is substantially independent of $V_s$. In driver circuit 50, a bias voltage, $V_{Bias}$ has been applied to the gate of transistor 22a, maintaining a constant current $I_P$ into node A. Accordingly, the voltage at node A will begin dropping from $V_s$ toward $V_{Ref}$ only when $V_{IN}$ provides sufficient gate drive to transistor 24a such that $I_N$ exceeds $I_P$, the current sourced by transistor 22a. Similarly, the voltage at node A will switch from $V_{Ref}$ to $V_s$ when $V_{In}$ drops below the gate voltage necessary for transistor 24a to generate a current $I_N$ that exceeds $I_P$.

Together, transistors 22a and 24a form a class input A amplifier in which constant current $I_P$ from transistor 22a determines the input voltage at which the drain of transistor 24a begins to switch between $V_{Ref}$ and $V_s$. Such class A amplifiers are discussed, for example, in Microelectronics", J. Millman & A. Grabel, McGraw-Hill, Inc. (1987), p. 802.

Figure 3A:
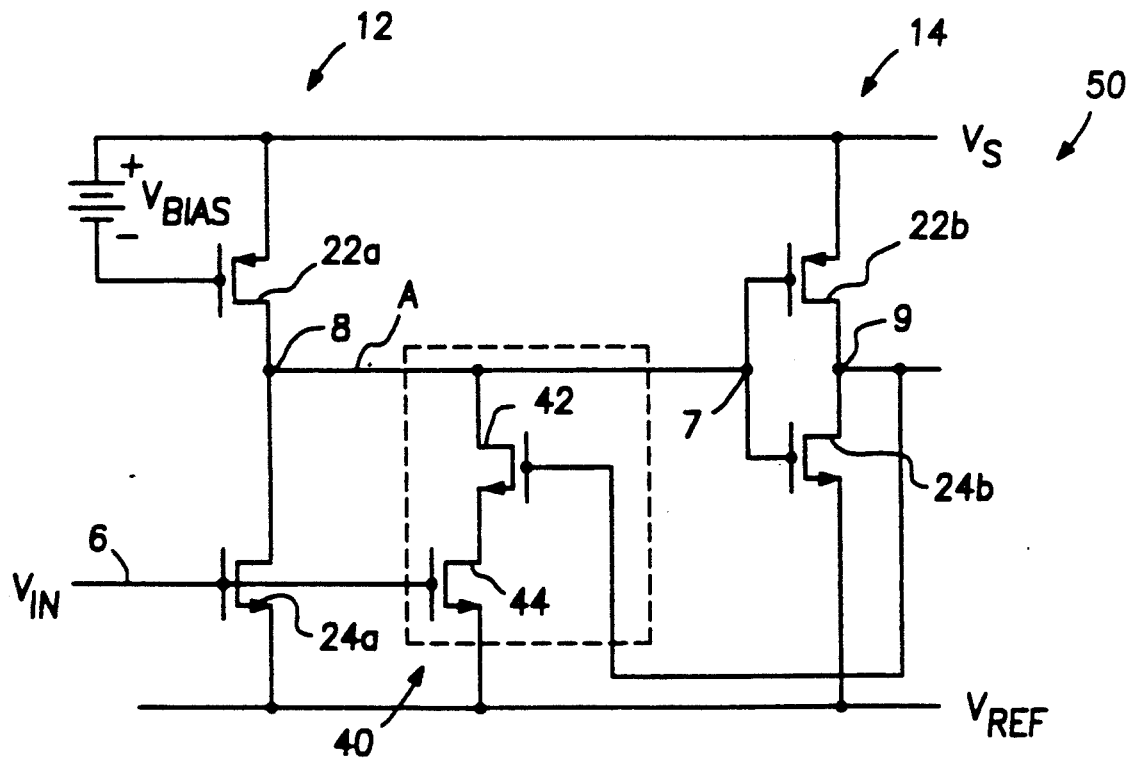
FIG. 3A is a schematic diagram of a circuit in accordance with the present invention having a feedback circuit of cascode connected NMOS transistors for providing a threshold voltage and hysteresis level that are substantially independent of the supply voltage.
Figure 3B:
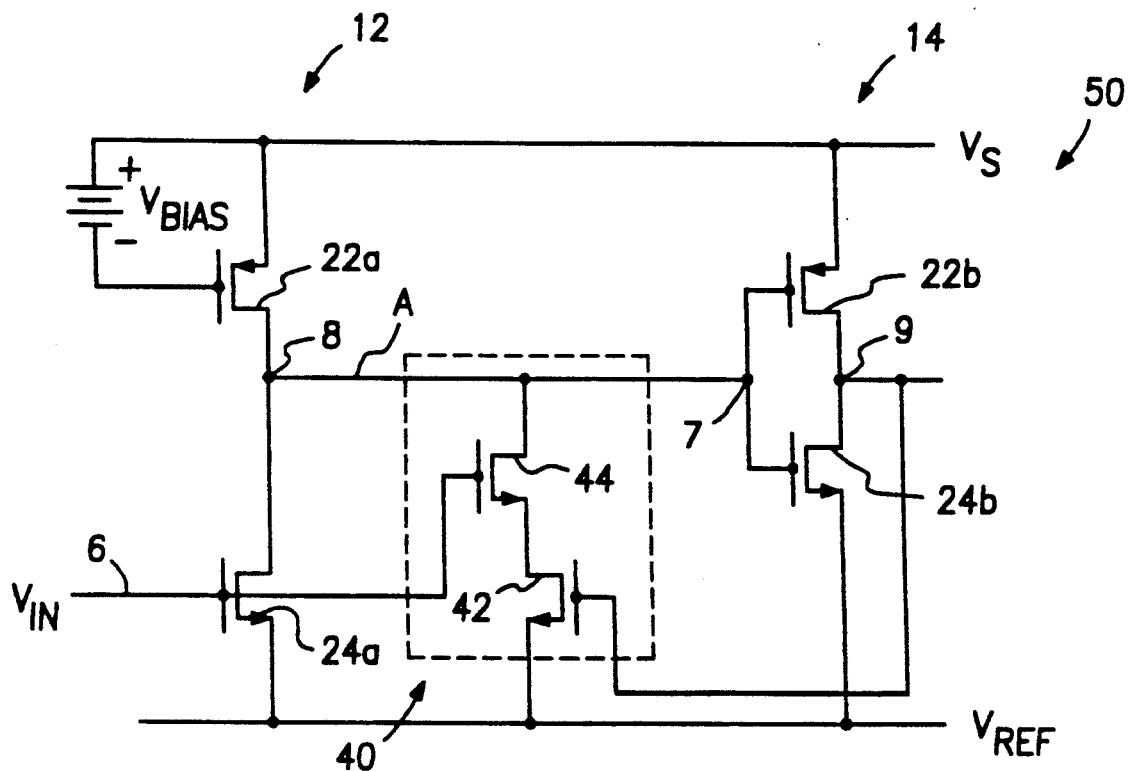
FIG. 3B is a schematic diagram of a driver circuit in accordance with the present invention in which the connections between the inputs of the cascode connected NMOS transistors and the driver circuit input and output have been reversed relative to the circuit of FIG. 3A.

Referring now to FIG. 3B, there is shown a driver circuit 50 which is similar to driver circuit 50 of FIG. 3A, having a $V_{TH}$ that is substantially independent of $V_S$. However, in driver circuit 50 of FIG. 3B, the drain of cascode transistor 44 is connected to output 8 of first inverter 12 and the source of cascode transistor 42 is connected to $V_{REF}$.

Figure 4A:
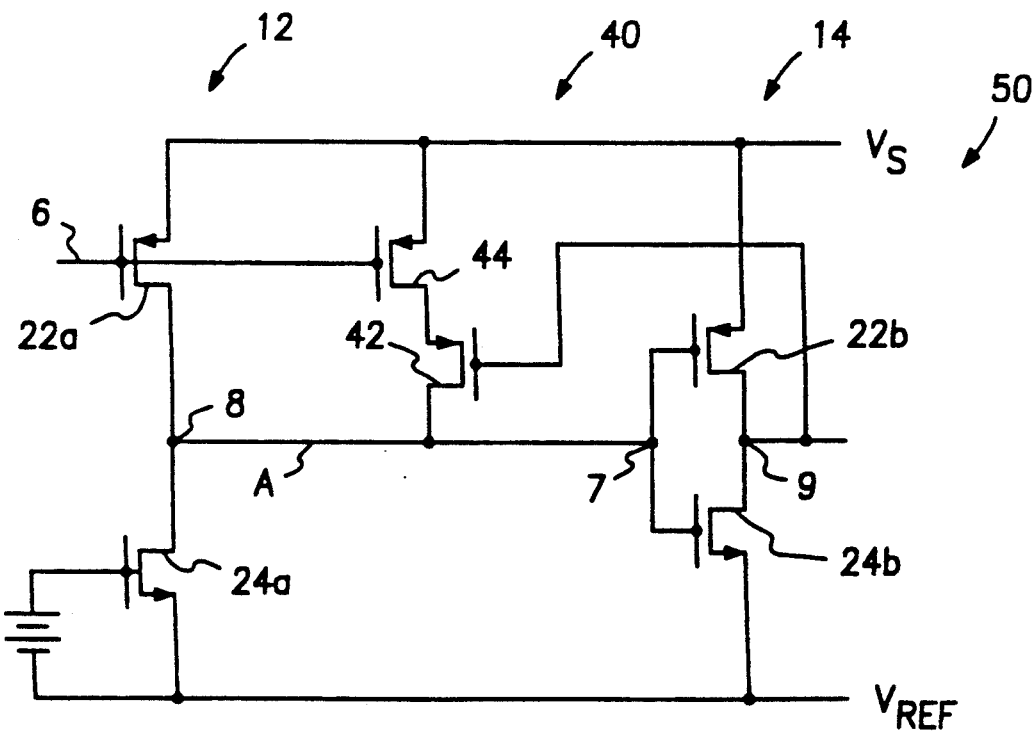
FIG. 4A is a schematic diagram of a driver circuit in accordance with the present invention having a feedback circuit of cascode connected PMOS transistors for providing a threshold voltage and hysteresis level that are substantially independent of the supply voltage.

Referring now to FIG. 4A, there is shown a driver circuit 50 implemented using PMOS cascode transistors 42, 44. The gate and source of cascode transistor 44 are connected to input 6 of first inverter 12 and $V_S$, respectively, and the gate and drain of cascode transistor 42 are connected to output 9 of second inverter 14 and node A at output 8 of first inverter 12.

Figure 4B:
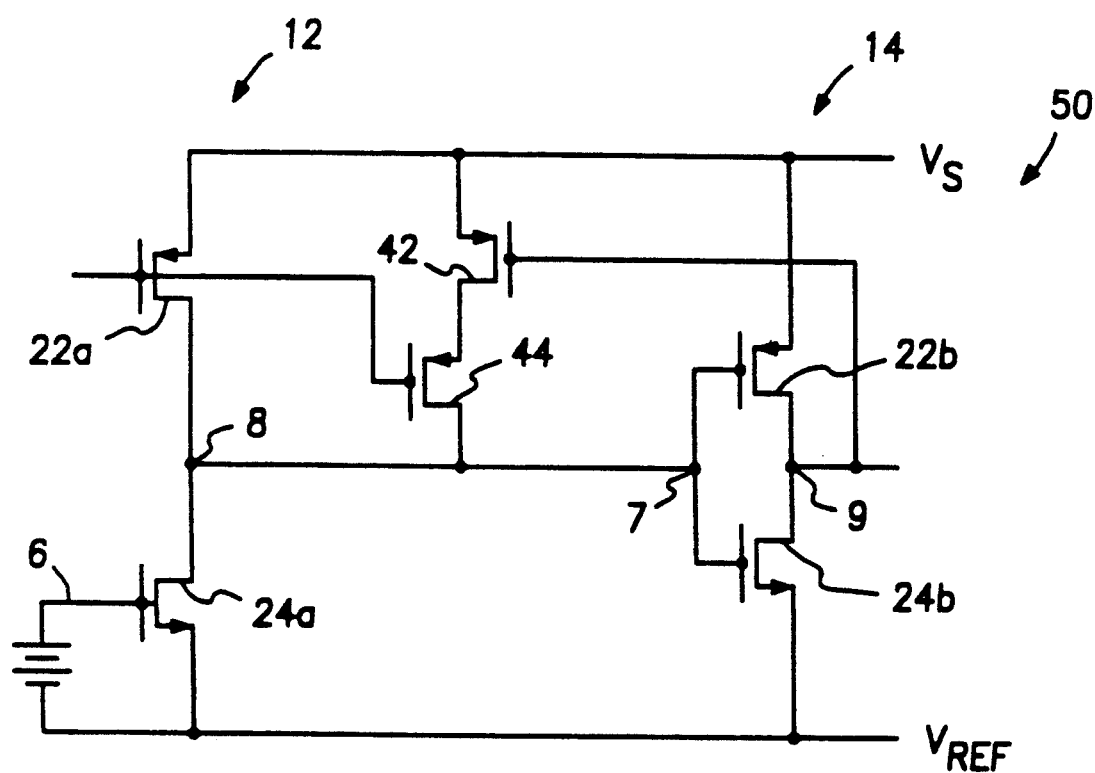
FIG. 4B is a schematic diagram of a circuit in accordance with the present invention in which the connections between the inputs of the cascode connected PMOS transistors and the driver circuit input and output have been reversed relative to the circuit of FIG. 4A.

Referring not to FIG. 4B, there is shown a driver circuit 50 which is also implemented using PMOS cascode transistors 42, 44 but with the drain of cascode transistor 44 connected to node A at output 8 of first inverter 12 and the source of cascode transistor 42 connected to $V_S$.

What is claimed is:

1. A fast, high performance driver circuit having a threshold voltage and a hysteresis level which are substantially independent of the supply voltage, the driver circuit comprising:

a first inverter including first and second transistors having opposite conductivity properties, each having a gate, source and drain, the drains of the first ad second transistors being connected to a common node to form an output of the first inverter, the first transistor having its gate connected to a bias voltage and its source connected to a supply voltage for supplying current to the node at the output of the first inverter according to the bias, and the second transistor having its gate forming an input for the first inverter as an input of the driver circuit, and its source connected to a reference voltage, the first inverter being a class A inverting amplifier for providing a threshold voltage that is substantially independent of the supply voltage;

a second inverter having an input and an output, the input of the second inverter being connected to the node at the output of the first inverter and the output of the second inverter forming the output of the driver circuit, for providing a signal at the driver circuit output having a polarity that is opposite to the polarity of the signal at the input of the second inverter;

a cascoded transistor pair having a pair of inputs formed by the gates of the cascoded transistors, an output formed by the drain of one of the cascoded transistors and a reference terminal formed by the source of the other cascoded transistor, one of the cascode inputs being connected to the driver circuit output, the other cascode input being connected to the driver circuit input, the cascode output being connected to the node at the output of the first inverter, and the cascode reference terminal being connected to a reference voltage, for controlling the flow of current from the first transistor of the first inverter into the drain of the second transistor and into the cascode transistors in response to voltage signals at the input and output of the driver circuit.

2. The fast, high performance driver circuit of claim 1 wherein the cascoded transistor having its gate connected to the output of the driver circuit also has a larger W/L ratio than the cascoded transistor having its gate connected to the input of the driver circuit.

3. The fast, high performance driver circuit of claim 2 wherein the cascoded transistors are N-channel MOSFETs and the reference potential is ground potential.

4. The fast, high performance driver circuit of claim 2 wherein the cascoded transistors are P-channel MOSFETs and the reference potential is the positive supply voltage.

5. The fast, high performance driver circuit of claim 1 wherein the cascode input connected to the driver circuit input and the cascode output connected to the node at the output of the first inverter are the gate and drain, respectively, of the same cascoded transistor.

6. The fast, high performance driver circuit of claim 1 wherein the cascode input connected to the driver circuit output and the cascode output connected to the node at the output of the first inverter are the gate and drain, respectively, of the same cascoded transistor.

* * * * *